United States Patent [19]

White et al.

[11] Patent Number: 4,784,936

[45] Date of Patent: Nov. 15, 1988

[54] PROCESS OF FORMING A RESIST STRUCTURE ON SUBSTRATE HAVING TOPOGRAPHICAL FEATURES USING POSITIVE PHOTORESIST LAYER AND POLY(VINYL PYRROLIDONE) OVERLAYER

[75] Inventors: Lawrence K. White, W. Windsor Township, Mercer County; Nancy A. Miszkowski, Lawrenceville, both of N.J.

[73] Assignee: General Electric Company, Fairfield, Conn.

[21] Appl. No.: 905,077

[22] Filed: Sep. 9, 1986

Related U.S. Application Data

[63] Continuation-in-part of Ser. No. 791,146, Oct. 24, 1985, abandoned.

[51] Int. Cl.$^4$ .............................................. G03F 7/26
[52] U.S. Cl. ....................................... 430/323; 430/166; 430/271; 430/311; 430/313; 430/322; 430/326; 430/312
[58] Field of Search ............... 430/326, 312, 325, 311, 430/313, 323, 322, 271, 166

[56] References Cited

U.S. PATENT DOCUMENTS

| 3,046,131 | 7/1962 | Schmidt et al. | 96/75 |
|---|---|---|---|
| 3,669,667 | 6/1972 | Skarvinko | 96/68 |
| 4,200,463 | 4/1980 | Flowers | 430/524 |
| 4,268,601 | 5/1981 | Namiki et al. | 430/159 |
| 4,268,611 | 5/1981 | Okishi et al. | 430/302 |
| 4,362,809 | 12/1982 | Chen et al. | 430/312 |
| 4,370,405 | 1/1983 | O'Toole et al. | 430/312 |
| 4,528,262 | 7/1985 | Nakano et al. | 430/325 |
| 4,609,614 | 9/1986 | Pampolone et al. | 430/325 |
| 4,618,565 | 10/1986 | White et al. | 430/326 |
| 4,663,275 | 5/1987 | West et al. | 430/326 |

FOREIGN PATENT DOCUMENTS

110165 6/1984 European Pat. Off. ............ 430/156

OTHER PUBLICATIONS

Griffing et al., *Solid State Technology*, May. 1985, pp. 152–157.

*Primary Examiner*—Charles L. Bowers, Jr.
*Attorney, Agent, or Firm*—Stanley C. Corwin; Birgit E. Morris; Kenneth R. Glick

[57] ABSTRACT

An improved process for forming multilayer resist structures for lithographic processing of a substrate having topographical features is provided. The structures are comprised of a resist layer having thereover a layer of poly(vinyl pyrrolidone). When the resist layer is a photoresist, the subject structures may optionally contain an absorptive layer directly overlying the substrate and/or a layer of contrast enhancement material overlying the planarizing layer. The poly(vinyl pyrrolidone) optionally contains from about 0.05 to about 0.1 percent by weight of a suitable surfactant, suitably a nonionic surfactant.

9 Claims, 1 Drawing Sheet

PROCESS OF FORMING A RESIST STRUCTURE ON SUBSTRATE HAVING TOPOGRAPHICAL FEATURES USING POSITIVE PHOTORESIST LAYER AND POLY(VINYL PYRROLIDONE) OVERLAYER

RELATED APPLICATIONS

This application is a continuation-in-part of U.S. patent application Ser. No. 791,146 filed Oct. 24, 1985, abandoned.

This invention relates to a process of forming a multilayer structure useful for lithographic processing of a substrate having topographical features.

BACKGROUND OF THE INVENTION

Two- and three-layer resist recording media and their use in forming patterned layers on a substrate having topographical features are well known. Such media are generally comprised of an organic planarizing layer overlying the substrate and a patterning or resist layer overlying the planarizing layer. In a conventional trilayer system, these layers are separated by an intermediate layer, generally an inorganic oxide or nitride, which functions as a hardmask for dry etching of the planarizing layer.

A significant problem in the use of multilayer resist systems such as described above is the definition of a pattern at a topographical step in the underlying substrate. Frequently, the pattern becomes constricted above the step. This phenomenon, known as "notching" or "necking", occurs with most conventional resist systems. Experience has shown that notching of a pattern feature, which occurs over a step, increases with the height of the step and, to a lesser degree, with the thickness of the layers that must be patterned over the step. It will be appreciated that, as the surface of a semiconductor substrate becomes more complex and the lithographic patterns to be defined shrink to less than one micrometer, there is an increasing need to better define lithographic patterns over steps in substrate topography. Such an improvement is provided in accordance with this invention.

SUMMARY OF THE INVENTION

An improved multilayer resist structure is formed on a substrate having topographical features by depositing on the substrate a layer of positive resist material and depositing thereover a water soluble planarizing layer of poly(vinyl pyrrolidone). Optionally, a thin absorptive layer is initially deposited to underlie the resist layer and/or a layer of contrast enhancement material is deposited to overlie the planarizing layer.

DETAILED DESCRIPTION OF THE INVENTION

Figure 1:
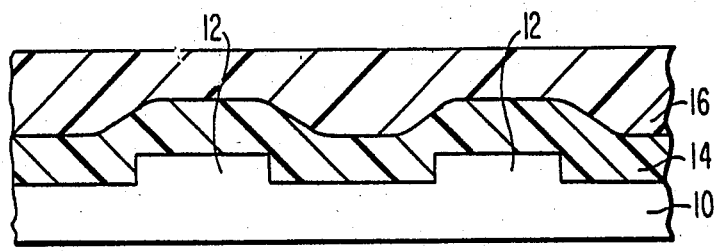
FIGS. 1-4 are elevational views in cross section illustrating two embodiments of this invention.

The substrates to be lithographically defined in accordance with this invention may be of any suitable material, for example, single crystal silicon, gallium arsenide, metallic silicides, polycrystalline materials with suitable surfaces, vitreous materials and the like. Topographical features on the substrate surface may be of the same or a different material. Generally, most topographical features will have a step height of 0.5 to 1.0 micrometer and may have any configuration.

The resist layer formed in accordance with the subject process may be of any conventional resist material. It is preferred for reasons which will become apparent that the resist be a positive resist which is developed with an aqueous alkaline developer. Suitable resists include, for example, novolac resin/diazoquinone sensitizer preparations such as OFPR 800 of Dynachem Corp., HPR 204 of Hunt Chemical Company, EK 809 of Eastman Kodak Company, AZ 1470 and AZ 1450J of American Hoechst Corporation and the like.

The resist layer may be applied to the substrate by any conventional procedure, preferably by spin-coating. The thickness of the resist layer is generally from about 0.5 to 2 times the height of the tallest topographical feature on the substrate. It is contemplated that, in general, the resist layer will be from about 0.5 to about 2.0, suitably about 1.0, micrometer thick. It is also contemplated that the resist layer will have a planarizing effect on substrate topography. The degree of planarizing provided by the resist layer will depend on the resist material utilized and the thickness of the layer.

In accordance with this invention, a layer of poly(vinyl pyrrolidone) ("PVP") is deposited over the resist layer. In contrast to conventional resist structures wherein the resist overlies a planarizing layer, the structure produced by the subject method possesses a number of advantages. In addition to possessing planarizing characteristics, PVP is substantially transmissive to the radiation utilized to irradiate the underlying resist layer, whether it be light, x-ray, electron beam or the like. Therefore, the thickness of the PVP layer can be increased without the need to substantially increase the irradiation dosage as would be the case if the thickness of the resist layer were to be increased to accomplish the same object. PVP is advantageous in being substantially more water soluble than other materials of a similar nature, such as poly(vinyl alcohol). Due to its water solubility, the thickness of the layer of PVP can be increased without appreciably adding to the development-time of the resist structure. This is an important consideration in carrying out the subject process on automatic equipment.

When a layer of contrast enhancement material (CEM) is deposited onto the PVP as discussed below, PVP is advantageous in forming an effective barrier to prevent commingling of the CEM and resist layers. Further, the tacky nature of the PVP layer enhances adhesion of the CEM layer.

In general, the thickness of the PVP planarizing layer deposited in accordance with the subject process is from about 0.5 to 1.5 times the height of the tallest topographical feature on the substrate. Therefore, the planarizing layer is suitably from about 0.25 to 1.5, preferably about 0.5, micrometer thick.

As shown in FIG. 1, a substrate 10 having topographical features 12 is initially coated with a layer of resist material 14, suitably by spin-coating. The resist material is conventionally applied as a solution in a solvent such as propylene glycol methyl ether acetate, available from Dow Corporation under the trademark Dowanol PMA, ethylene glycol ethyl ether acetate, cyclohexanone and the like. The coating of resist solution is allowed to dry and then soft-baked, generally at from about 90° to 105° C., to form a resist layer 14.

A solution of PVP is then spin-coated over the resist layer 14 and dried to form a planarizing layer 16. Because PVP is applied in an aqueous or hydroalcoholic solvent, there is essentially no intermixing of the layers. The solution of PVP preferably contains a minor amount, i.e. from about 0.05 to about 0.1 percent by weight, of a surfactant. Suitable surfactants are nonionic surfactants such as octoxynol, a polyoxyethylene alcohol and the like. The surfactant acts to improve both the spin-coating and planarizing characteristics of the PVP solution.

Figure 2:
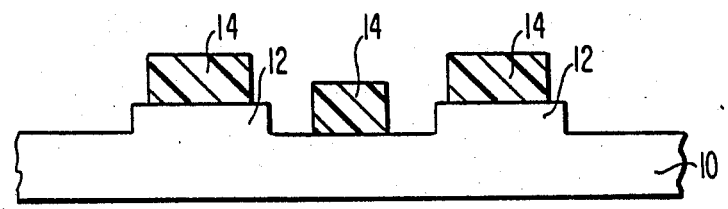

The structure is then pattern-irradiated with light, electron beam, x-ray or the like and developed. Since the irradiated portion of the resist layer 14 becomes soluble in an aqueous developer, a single development step removes the entire PVP layer 16 and the irradiated portion of the resist layer 14, thus forming the structure illustrated in FIG. 2.

In addition to simplicity in processing, the structure illustrated in FIG. 1 is advantageous in that there is no need to define a thick planarizing layer under the resist layer as is the case with conventional multilayer resist structures. Also, the irradiation is striking a planar surface which promotes uniformity of the image. The result of these factors is that the resist structures formed by the subject process produce a sharply patterned resist layer with substantially reduced notching where the pattern passes over steps in substrate topography.

Figure 3:
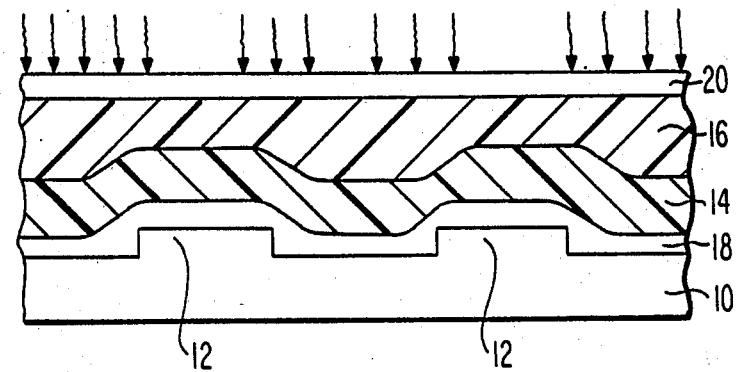
Figure 4:
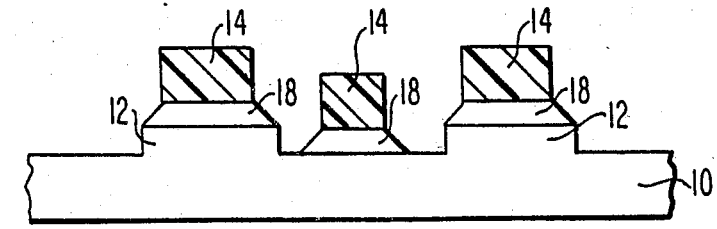

In the structure illustrated in FIGS. 3 and 4, the resist material is a photoresist and up to two additional layers are utilized to sharpen the image, particularly when it is desired to form patterns having dimensions of one micrometer or less. Although both additional layers are illustrated in FIG. 3, either may be utilized independent of the other.

In FIG. 3, the substrate 10 is initially coated with an absorptive layer 18. This is a relatively thin layer, suitably from about 100 nm to about 500 nm in thickness, which will absorb light at the wavelength utilized to irradiate the structure. Such absorptive layers are conventionally used in multilayer resists to prevent loss of resolution by absorbing the light passing through the photoresist layer, thereby preventing light from reflecting back from the substrate into nonirradiated portions of the photoresist layer. A preferred absorptive layer of the present invention is formed from a solution of poly(methylmethacrylate), or a copolymer of methylmethacrylate and methacrylic acid, and a suitable dye which is insoluble in the solvent utilized for the photoresist layer. Such absorptive layers are disclosed and claimed by White et al. in copending U.S. patent application Ser. No. 741,358, filed June 5, 1985, U.S. Pat. No. 4,618,565, the disclosure of which is incorporated herein by reference.

The absorptive layer 18 is spin-coated onto the substrate, allowed to dry and then baked to drive off residual solvent. The photoresist layer 14 and the PVP layer 16 are then formed as described above. As shown in FIG. 3, a four layer structure may be formed by adding a layer of contrast enhancement material (CEM) 20. The concept and use of a CEM layer is known and such materials are commercially available. Suitable commercial contrast enhancement materials include CEM-388 amd CEM-420 available from the Silicone Products Division of General Electric Company. In essence, such materials are comprised of a solution of a suitable polymer and a dye which is bleachable at the wavelengths utilized to irradiate the structure. The light striking the CEM layer 20 causes it to turn from opaque to substantially transmissive to the irradiating light. Although the presence of a layer of CEM 20 requires some increase in irradiation time, this is more than offset by the fact that the image received by the photoresist layer 14 is considerably sharpened.

A particularly preferred structure formed by the subject process is a photoresist layer having thereover a PVP planarizing layer and a CEM layer. The PVP layer permits the use of a thinner photoresist layer than would be necessary if the CEM layer were applied directly onto the resist layer. This is because, conventionally, thickness variations in the CEM layer will produce dimensional changes in an underlying photoresist layer which, combined with commingling of the two layers, can produce significant distortion in the photoresist pattern. The PVP planarzinging layer also substantially reduces thickness variations in the CEM layer which enhances the uniformity of the photoresist pattern.

As shown in FIG. 3, the four-layered structure is pattern irradiated by a conventional step-and-repeat aligner such as an Optimetrix 8010, a Perkin Elmer scanning projection machine and the like. The CEM layer 20 is then removed utilizing a suitable organic solvent. The PVP planarizing layer 16 and the photoresist layer 14 are developed in a single step as discussed above leaving a patterned layer of photoresist 14 overlying portions of the absorptive layer 18. Alternatively, the PVP layer 16 may be removed with only water and the photoresist layer then developed with an aqueous alkaline developer such as is conventionally utilized for such materials. Because of the solubility of the PVP layer 16, however, it is preferred to combine removal thereof with development of the photoresist layer 14. The exposed portion of the absorptive layer 18 is then etched, suitably in an oxygen plasma, to produce the structure shown in FIG. 4. In the structure shown in FIG. 4, the conditions of the plasma etch were adjusted to produce an isotropic etch of the absorptive layer 18.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

Silicon wafers three inches in diameter having isolated silicon dioxide topographical features 0.5 micrometer in height were utilized as substrates.

A layer of the commercial photoresist OFPR 800 having a viscosity of 30 centipoise was spin-coated onto the substrates, allowed to air dry, and then soft-baked on a hotplate at 105° for 60 seconds to form a layer 1.2 micrometers thick, measured on the substrate surface.

A 5 percent aqueous solution of poly(vinyl pyrrolidone), which had an average molecular weight of about 40,000, was spin-coated onto the photoresist layer and baked at 105° for 45 seconds on a hotplate to form a transparent planarizing layer 0.5 micrometer thick. The commercial contrast enhancement material CEM-388 was spin-coated onto the poly(vinyl pyrrolidone) layer and spin-dried to form an opaque layer 0.4 micrometer thick.

The structure was irradiated with light at 405 nm with an Optimetrix 8010 stepper. The CEM-388 layer was stripped with an equal mixture of anisole and toluene. The wafers were then placed in NMD-3, an aqueous alkaline developer recommended for the photoresist. The entire poly(vinyl pyrrolidone) layer and the irradiated portion of the photoresist layer were removed.

A pattern of one micrometer lines and spaces was cleanly defined on the substrates and topography. Microscopic examination of the photoresist pattern showed it to be substantialy free of notching where it passed over steps in the substrate topography. The line-width deviation over topography was, on the average, less than 200 nm. These results clearly demonstrate the excellent dimensional control of resist structures provided by the subject process.

We claim:

1. A process of forming a patterned resist structure on a substrate having topographical features comprising:
   (a) depositing onto the substrate a layer of positive photoresist material;
   (b) depositing over the photoresist layer a layer consisting essentially of poly(vinyl pyrrolidone) to a thickness from over 0.5 up to 1.5 times the height of the tallest topographical feature;
   (c) pattern irradiating the structure with radiation that the positive photoresist material is radiation sensitive to;
   (d) removing the poly(vinyl pyrrolidone) layer; and
   (e) developing the photoresist layer by removing radiation exposed areas, whereby a portion of the substrate is exposed.

2. A process in accordance with claim 1, wherein and steps (d) and (e) are carried out simultaneously with an aqueous developer.

3. A process in accordance with claim 1, wherein said process additionally includes the steps of coating the substrate prior to step (a) with a layer of a material which is absorptive at the light frequency utilized to irradiate the photoresist layer, and, after step (e) removing that portion of said absorptive layer that is exposed by development of the photoresist layer.

4. A process in accordance with claim 1, wherein said process additionally includes the steps of, prior to step (c) coating the layer of poly(vinyl pyrrolidone) with a layer of an opaque contrast enhancement material, the portion of which when irradiated by the light utilized to irradiate the photoresist layer becomes substantially transmissive of said light, and after step (c) removing said contrast enhancement layer prior to removing the poly(vinyl pyrrolidone) layer.

5. A process of forming a patterned resist structure on a substrate having topographical features comprising;
   (a) coating the substrate with a layer of material which is absorptive at the light frequency utilized to irradiate said structure;
   (b) coating the absorptive layer with a layer of positive photoresist material;
   (c) coating the photoresist layer with a layer consisting essentially of poly(vinyl pyrrolidone) to a thickness from over 0.5 up to 1.5 times the height of the tallest topographical feature;
   (d) coating the poly(vinyl pyrrolidone) layer with a layer of an opaque contrast enhancement material, that portion of which when irradiated by the light utilized to irradiate the structure becomes substantially transmissive of said light;
   (e) pattern irradiating the structure with light;
   (f) removing the contrast enhancement layer;
   (g) removing the poly(vinyl pyrrolidone) layer;
   (h) developing the photoresist layer by removing radiation exposed areas, whereby a portion of the absorptive layer is exposed; and
   (i) removing the exposed portion of the absorptive layer thereby exposing the underlying portion of the substrate.

6. A process in accordance with claim 5, wherein steps (g) and (h) are carried out simultaneously with an aqueous developer.

7. A process in accordance with claim 1, wherein the poly(vinyl pyrrolidone) layer is formed by coating the resist layer with an aqueous solution of poly(vinyl pyrrolidone) additionally containing from about 0.05 to about 0.1 percent by weight of a surfactant.

8. A process in accordance with claim 7, wherein the surfactant is a nonionic surfactant.

9. A process in accordance with claim 8, wherein the surfactant is a polyoxyethylene alcohol.

* * * * *